US006432182B1

(12) United States Patent
Konrad et al.

(10) Patent No.: US 6,432,182 B1
(45) Date of Patent: Aug. 13, 2002

(54) TREATMENT SOLUTION FOR REDUCING ADHESIVE RESIN BLEED

(75) Inventors: John Joseph Konrad; Konstantinos I. Papathomas, both of Endicott; John A. Welsh, Binghamton, all of NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 09/588,459

(22) Filed: Jun. 6, 2000

Related U.S. Application Data

(62) Division of application No. 09/108,598, filed on Jul. 1, 1998, now Pat. No. 6,099,959.

(51) Int. Cl.[7] .............................. C09D 5/38; C09K 3/18
(52) U.S. Cl. ............................. 106/2; 106/33; 106/243; 252/364
(58) Field of Search ......................... 252/364; 106/243, 106/2, 33; 510/437

(56) References Cited

U.S. PATENT DOCUMENTS

| | | | |
|---|---|---|---|
| 1,979,385 A | * 11/1934 | Harvey, Jr. | ............ 510/437 X |
| 2,206,046 A | * 7/1940 | Pollard | ................... 106/243 X |
| 3,606,677 A | 9/1971 | Ryan | ........................... 29/625 |
| 4,143,456 A | 3/1979 | Inoue | .......................... 29/588 |
| 4,740,830 A | 4/1988 | Ketley | ......................... 357/67 |
| 5,006,575 A | * 4/1991 | Chan | .......................... 523/458 |
| 5,079,595 A | * 1/1992 | Suzuki et al. | .................. 357/8 |
| 5,125,153 A | 6/1992 | Frey et al. | .................... 29/840 |
| 5,306,444 A | * 4/1994 | Kitamura et al. | ....... 510/437 X |
| 5,348,607 A | 9/1994 | Wojnarowski et al. | ...... 156/298 |
| 5,348,913 A | 9/1994 | McBride et al. | ............ 437/209 |
| 5,409,863 A | 4/1995 | Newman | .................... 437/209 |
| 5,523,194 A | * 6/1996 | Archer | ...................... 106/2 X |
| 5,713,997 A | * 2/1998 | Kuramoto et al. | ..... 106/287.18 |
| 5,773,395 A | * 6/1998 | Charlez et al. | ......... 510/437 X |
| 6,099,959 A | * 8/2000 | Konrad et al. | .............. 106/2 X |

OTHER PUBLICATIONS

"Entek® 996" Enthone–OMI, Inc., RL01, Jan. 9, 1995, Material Safety Data Sheet.
"Entek® 996" Enthone–OMI, Inc., 1995, Technical Data Sheet.

* cited by examiner

*Primary Examiner*—Richard D. Lovering
(74) *Attorney, Agent, or Firm*—James A. Lucas; Driggs, Lucas, Brubaker & Hogg Co., LPA

(57) ABSTRACT

In accordance with the present invention, a method of treating the surface of an organic substrate, particularly a circuitized surface of an organic substrate, which method reduces the spread of adhesive resin that is subsequently deposited on the surface, is provided. This method comprises the steps of applying a treatment solution comprising a fatty acid compound, an alkalizing agent, and a solvent comprising water and from about 5% to about 90% by volume of an organic solvent selected from the group consisting of an alcohol, a glycol ether, and combinations thereof to the surface; and then removing substantially all of the solvent from the solution to provide a thin film on the surface of said substrate. The film comprises the fatty acids that were present in the treatment solution. In a preferred embodiment the treatment solution further comprises a chelating agent. The present invention also relates to a treatment solution for reducing adhesive resin bleed on the surface of a circuitized organic substrate. The present invention also relates to a circuitized organic substrate that is resistant to resin bleed. Such substrate has a film comprising a fatty acid compound disposed on the circuitized surface thereto.

8 Claims, No Drawings

TREATMENT SOLUTION FOR REDUCING ADHESIVE RESIN BLEED

CROSS REFERENCE TO RELATED APPLICATION

This application is a divisional of application Ser. No. 09/108,598, filed Jul. 1, 1998, now U.S. Pat. No. 6,099,959.

FIELD OF THE INVENTION

This invention relates generally to a method of controlling the spread of an adhesive on a circuitized organic substrate. More particularly, this invention relates to a method of forming a protective coating on the surfaces of a circuitized organic substrate. Such protective coating reduces the spread of adhesives that contact or are disposed on the surfaces of the substrate.

BACKGROUND OF THE INVENTION

Semiconductor devices typically comprise an integrated circuit die and a plastic chip carrier that is comprised of an organic substrate, such as polyimide, having metallic circuitry and wire bond pads disposed on a surface thereof Frequently, one of the initial stages in assembly of the semiconductor device involves attachment of the chip carrier to a lead frame by means of a thixotropic organic adhesive such as, for example, an epoxy-based adhesive, an acrylic-based adhesive, or a silicone. During this process, which is referred to as the board-attach process, the adhesive is applied to the lead frame. Then the chip carrier is placed onto the adhesive. The assembly may then be heated to assist in cure of the adhesive, thereby strengthening the attachment between the organic substrate and the lead frame.

Adhesives are also used to attach the integrated circuit die to the circuitized surface of the chip carrier. Such adhesives, generally, contain an organic binder and an electrically or thermally conductive filler. The adhesive, which initially is in the form of a viscous liquid or paste, is distributed onto preselected regions on the circuitized surface. The preselected regions include chip pads which are formed by selectively plating gold on a nickel plated copper surface. Thereafter, the perimeter of integrated circuit die is aligned with and placed on the adhesive. The entire structure, including substrate, adhesive and die, is then baked to cure the adhesive, thereby strengthening the attachment between the integrated circuit die and the underlying substrate. In some cases, the integrated circuit die is then electrically connected to the electric circuitry of the carrier by wire bonding terminals on the chip to wire bond pads on the surface of the substrate.

Although the adhesives used during the various stages of assembling the resulting module are fairly viscous, the organic liquids in the adhesives have a propensity to bleed and spread out away from the point of attachment. For example, during the board attach process, these organic liquids often bleed out from the periphery of the chip carrier attachment site and spread up the edges of the chip carrier onto the circuitized upper surface, where the organic liquids can contaminate the wire bond pads and render them non-bondable. This condition, which is hereinafter referred to as "adhesive resin bleed", can cause significant problems during later assembly steps when the bond sites are needed to complete necessary electrical connections. The spreading organic liquid can also contaminate any portions of a soldermask which may lie in the near vicinity of the wire bond pads.

Adhesive resin bleed is also encountered during other stages of assembling the resulting module. For example, the resin in the electrically conductive or non-electrically conductive adhesive that is used to attach the integrated circuit die to the chip carrier can also bleed out during cure. The heat and pressure encountered during cure causes the resin to bleed out from the periphery of the die attachment area and spread out over adjacent areas where electrical connections ultimately need to be made.

The problems associated with adhesive resin bleed are even more pronounced when the chip carrier is treated with a plasma containing oxygen and/or argon, prior to the application of the adhesive. Such plasma treatment is frequently employed prior to assembly of the semiconductor module to clean the wire bond pads and to roughen the surface of the substrate. Adhesive resin bleed becomes an even greater problem when the surface of the substrate is roughened by pumice treatment.

Various methods for reducing contamination of the electrical bonding sites by adhesive resin bleed have been developed. For example, the chip carrier surface may have a recess at the point of attachment of the chip, such that the back of the chip and the adhesive will be positioned below the adjoining circuitized surface of the chip carrier where electrical bonding sites are located. Unfortunately, not all integrated circuit assemblies provide the option of a recessed cavity in the carrier surface. Very large scale integrated assemblies require a large number of bonding sites, and these sites, typically, are on the same level of the carrier surface as the chip attachment site.

In some instances mechanical barriers have been used to control adhesive resin bleed onto the bonding sites. For example, in U.S. Pat. No. 5,409,863 issued on Apr. 25, 1995, a low profile barrier, such as a solder mask ring surrounds the chip attachment site. During cure, the ring prevents the spread of adhesive resin onto the adjacent bonding sites on the chip carrier. Unfortunately, the ring does not completely prevent adhesive resin bleed when the chip carrier is treated with an oxygen or argon containing plasma.

Accordingly, a chip carrier having a surface that is resistant to adhesive resin bleed is desirable. Furthermore, a method of imparting adhesive resin repellency to the surface of the chip carrier and to the metallic components on the surface is desirable. A method which does not reduce the bondability of the wire bonding sites is especially desirable.

SUMMARY OF THE INVENTION

In accordance with the present invention, a method of treating the surface of an organic substrate, particularly a circuitized surface of a chip carrier, which method reduces the spread of adhesive resin that is subsequently deposited on the surface, is provided. This method comprises the steps of applying a treatment solution comprising a fatty acid compound, an alkalizing agent, and a solvent comprising water and from about 5% by volume to about 90% by volume of an organic solvent selected from the group consisting of alcohol, glycol ether, and combinations thereof to the surface; and then removing substantially all of the solvent from the solution to provide a thin film on the surface of said substrate. The film comprises the fatty acids that were present in the treatment solution. In a preferred embodiment the treatment solution further comprises a chelating agent.

The present invention also relates to a treatment solution for reducing adhesive resin bleed on the surface of a circuitized organic substrate. The present invention also relates to a circuitized organic substrate that is resistant to resin bleed. Such substrate has a film comprising a fatty acid compound disposed on the circuitized surface thereto. In accordance with the present invention, it has been determined that organic substrates having a film comprising a fatty acid compound on the surface thereof are less wettable with respect to the organic liquids that are normally present in the adhesives that are used to bond chip carriers to integrated circuit chips and to lead frames. It has also been determined that the presence of the film on the surface of the organic substrate reduces adhesive resin bleed. It has also been determined that the presence of the film on the metallic components of the circuitized surface of a chip carrier renders the metallic components less wettable to the organic liquids present in such adhesives. It has also been determined that the presence of the film does not adversely affect the subsequent bonding of wires to the metal components on the surface of a chip carrier.

DETAILED DESCRIPTION

In accordance with the present invention, a method for conditioning a surface of an organic substrate, particularly a circuitized surface of an organic substrate, to provide a surface that is resistant to adhesive resin bleed is provided. The method comprises the steps of applying a treatment solution to the surfaces of the substrate and, preferably, to the surfaces of the metallic components on the circuitized surface of the substrate, and then removing substantially all of the solvent from the solution to provide a thin, dry, protective film on the treated surfaces of the substrate and metallic components. Such film makes the surface of the substrate less wettable with respect to the organic liquids that are found in the uncured adhesives that are used to attach chip carriers to lead frames and to integrated circuit dies. In the preferred embodiment, the substrate is a chip carrier.

Treatment Solution

The treatment solution has a pH of from about 7.2 to about 10.6 and comprises a fatty acid compound, an alkaling agent, an aqueous or water-based solution comprising from about 5% to about 70% of an organic solvent selected from the group consisting of alcohol, glycol ether, and combinations of such solvents and, preferably, a chelating agent. Fatty acid compound as used herein means a fatty acid, a salt of a fatty acid or an ester of a fatty acid. Fatty acid compounds suitable for forming the treatment solution can be represented by the following formula:

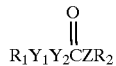

wherein $R_1$ is a saturated or unsaturated hydrocarbon having 5 to 32 carbon atoms;

$Y_1$ is a H, a hydrocarbon, or a hydroxyl at any position along $R_1$;

$Y_2$ is a H, a hydrocarbon, or a hydroxyl at any position along $R_1$

Z is O, N, or S; and $R_2$ is a saturated or unsaturated, branched or unbranched hydrocarbon having 1 to 12 carbon atom, a salt, or H.

The concentration of the fatty acid compound in the treatment solution is from about 0.001% to about 0.5% by weight of the solution, preferably from about 0.001% to 0.01% by weight of the solution.

Suitable alkalizing agents include but are not limited to KOK NaOH, Ca(OH)$_2$, NH$_4$OH, and triethanolamine. Preferably the alkalizing agent comprises less than 5% by weight of the treatment solution. Chelating agents as used herein refer to compounds which are used to remove metal ions from a solution. Suitable chelating agents include, but are not limited to, EGTA, triethanolamine, and, preferably, EDTA Preferably, the chelating agent comprises from 0.01 to about 3% by weight of the treatment solution.

Alternatively, a concentrated solution of a product from ENTHONE OMI, Inc., New Haven, Conn., available under the trade name ENTEK 996 can be combined with a solvent which contains water and, preferably, an alcohol, to prepare the treatment solution. ENTEK 996 comprises a fatty acid, EDTA, butyl carbitol, sodium hydroxide, and water. In instances where ENTEK 996 is used to prepare the treatment solution, it is preferred that ENTEK 996 comprises from about 0.05 to about 10% by volume, more preferably from about 0.2 to about 5% by volume, most preferably from about 0.9% to about 3% by volume of the final treatment solution.

Suitable solvents include but are not limited to aqueous or water-based solutions that contain water, preferably deionized water and from about 5% to about 90% by volume of an organic solvent selected from the group consisting of an alcohol, a glycol ether, and combinations thereof Preferably, the aqueous solution comprises from about 5% to about 70% by volume of the organic solvent, more preferably from about 10% to about 30%. The preferred alcohol is an aliphatic alcohol. Representative alcohols are, by way of example, methanol, ethanol, propanol, isopropanol, butanol, pentanol, and amyl alcohol. Suitable gycol ethers are, for example, diethylene glycol monobutyl ether, ethylene glycol monomethyl ether, diethylene glycol monomethyl ether, diethylene glycol monomethyl ether acetate or ethylene glycol monometh ether acetate. Most preferably, the solvent is an aqueous solution comprising an alcohol, wherein the alcohol is from about 10% to about 30% by volume of the aqueous solution.

TREATMENT

The treatment solution is heated to a temperature of from about 60° C. to about 80° C. and then applied to the surface of the substrate. The solution is applied by dipping the substrate in the solution, flowing the solution over the surface of the substrate, or spraying the surface of the substrate with the solution, preferably using a fluid-head apparatus. The process time for treatment with the heated treatment solution is preferably from about 30 seconds to about 60 seconds.

The treatment solution can be applied to any organic resinous material which normally is used to form the underlying substrate of a semiconductor chip carrier. Examples of resinous materials which are used to form such underlying substrates include for example epoxy-based resins, epoxy resins reinforced with woven fiberglass, polyimides and bismaleimide/triazine resins and combinations thereof. Furthermore, the treatment solution may also be applied to the inorganic materials that are used to form the circuit lines, the ground pads, and the wire bond sites which are on the surface of the circuitized substrate. Such inorganic materials include, for example, copper from which the circuitry is formed and gold, which along with nickel is plated over the copper circuitry to provide a wire bondable surface and to provide protection against corrosion Following application of the treatment solution to the desired surfaces, substantially all of the solvent is removed from the applied solution to provide a thin film of fatty acids on the surface of the substrate. Solvent is removed from the treatment solution at a time and temperature effective to remove at least 97%, preferably greater than 99% of the solvent from the applied solution. The solvent may be removed by heating the surface of the substrate, baking the substrate or, preferably, by air drying the substrate at room temperature. It has been determined that baking the substrate at a temperature of from about 120° to 140° C. for about 1 to 10 minutes achieves the desired result. Removal of the solvent results in the disposition of a film comprising the respective fatty acid compound on the surface to which the solution has been applied. The film comprises from about one to about 3 layers and has a thickness of less than 300 angstroms, preferably less than 100 angstroms, more preferably of from about 40 to about 60 angstroms.

Following formation of the film, an adhesive, preferably a bonding adhesive is applied to a lead frame. The substrate is then placed on a lead frame, and the adhesive cured under conditions of elevated temperature for a time sufficient to attach the substrate to a lead frame. Then an adhesive, preferably a silver containing die attach adhesive is applied to selected chip bonding sites on the top surface of the substrate. Thereafter, an integrated circuit die is placed on the adhesive, which is then cured under conditions of elevated temperature and pressure to bond the integrated circuit die.

It has been found that treatment of a circuitized organic substrate in accordance with the present invention renders the surface of the organic substrate and the surface of any metallic components that, preferably, are present on a surface of the substrate less wettable to the organic liquids contained in a typical uncured adhesive material, such as, for example, a liquid epoxy. It has also been found that treatment of the circuitized organic substrate in accordance with the present invention minimizes or even eliminates resin bleed from adhesives that are subsequently deposited onto or that come into contact with a surface of the substrate, even when such substrates have been subjected to pumice treatment. As a result, contamination of the wire bond pads by the organic liquids that are present in the uncured adhesive is eliminated when chip carriers are treated in accordance with the present invention.

It has also been found that treatment of the circuitized substrate in accordance with the present invention results in the formation of a thin fatty acid compound-containing film on the surface of the organic substrate, the surface of the metallic components plated thereon, and on the surface of any solder masks which are present on the surface of the substrate. It has also been found that the presence of such film on the surface of the metallic components does not diminish the strength of the bonds formed between the wire bond sites on the surface of the substrate and the wires which are subsequently used to connect the wire bond sites to the integrated circuit die nor diminishes the integrity of this electrical contact.

The following non-limiting examples are presented to further illustrate the present invention.

EXAMPLES

Example 1

Three separate treatment solutions having a pH of 9.5 and comprising 2%, or 3%, or 5% by volume of Entek-996 and 98%, 97% and 95% by volume, respectively, of an aqueous solution containing 20% by volume of isopropyl alcohol were heated to a temperature of approximately 70° C. Each of the treatment solutions was then applied to the surface of a different chip carrier. The chip carriers were comprised of a polyimide substrate whose surfaces had been roughened by pumice treatment, which substrate had gold-plated circuitry in the form of ground pads and wire bond sites plated on one surface thereof The treatment solutions, applied via a dip coating method, were allowed to dry at room temperature. The coated substrates were then exposed to moderate heat of about 120° C. to 150° C. for about 5 to 30 minutes. The contact angles formed by a sessile drop of an organic cycloaliphatic epoxide diluent (ERL-4299) on both the gold and polyimide surfaces of the chip carrier were then measured.

The contact angles were measured using a Rame-hart, Inc. Mountain Lakes, N.J.) Goniometer, Model No. 100-00115. The surface to be measured was placed in a horizontal position, facing upward, in front of a light source. A drop of the organic liquid ERL4299 was placed on top of the surface so that the contours of the sessile drop could be viewed and the contact angle measured.

A drop of a silver conductive adhesive was placed on the surface of the ground pad and onto the polyimide substrate and cured at a temperature of 180° C. for 15 minutes. The substrate and pad were then examined for evidence of adhesive resin bleed. In addition, a lead frame was attached to a bottom surface of the substrate via an adhesive under conditions of elevated temperature. The top surface of the substrate was examined for evidence of the kurfing effect, i.e., adhesive resin bleed up the edges of the substrate to the top surface thereof. The results of each of these studies are shown in Table 1.

Example 2

Circuitized chip carriers, whose surfaces had not been roughened by pumice treatment, were treated as described above in example 1 except that the treatment solutions contained either 0.5%, or 1%, or 3% by volume of ENTEK-996 and 99.5%, or 99% or 97% by volume, respectively, of an aqueous solution containing 20% by volume of isopropyl alcohol. The contact angles formed by a sessile drop of ERL-4299 on both the gold and polyimide surfaces of the chip carrier were then measured as described in example 1. The effect of treatment with these solutions on die attach bleed and lead frame attach bleed was also determined as described in example 1. The results are shown in Table 1.

Example 3

Circuitized chip carriers, whose surfaces had not been roughened by pumice treatment were treated as described above in example 1 except that the treatment solution contained 0.1% by weight of stearic acid in an aqueous solution containing 20% isopropyl alcohol (v/v) and 2% $NH_4OH$ (v/v). The contact angles formed by a sessile drop of ERL4299 on both the gold and polyimide surfaces of the chip carrier were then measured as described in example 1. The effect of treatment with these solutions on die attach bleed and lead frame attach bleed was also determined as described in example 1. The results are shown in Table 2.

Example 4

Circuitized chip carrier, whose surfaces had not been roughened by pumice treatment were treated as described above in example 1 except that the treatment solution contained 0.1% w/v of stearic acid in an aqueous solution containing 20% isopropyl alcohol (v/v) and 2%triethanolamine (v/v). The contact angles formed by a sessile drop of ERL4299 on both the gold and polyimide surfaces of the chip carrier were then measured as described in example 1. The effect of treatment with these solutions on die attach bleed and lead frame attach bleed was also determined as described in example 1. The results are shown in Table 2.

Comparative Example A

A mixture containing about 80 mL of isopropyl alcohol and 20 mL of water was mixed and kept at room temperature. The mixture was then applied onto a chip carrier via a dip coating method and allowed to dry at room temperature. The coated chip carrier was then exposed to moderate heat of about 120° C. for about 5 to 30 minutes. The contact angles formed by a sessile drop of diluent ERL-4299 on both the gold and polyimide surfaces of the chip carrier were measured as described above in example 1. The effect of treatment with this solution on die attach bleed and lead frame attach bleed was also examined as described in Example 1. The results are shown in Table 1.

Comparative Example B

A mixture containing about 80 mL of butyl carbitol and 20 mL of water was prepared and applied onto a chip carrier via a dip coating method as described in comparative example A. The contact angles formed by a sessile drop of diluent ERL4299 on both the gold and polyimide surfaces of the chip carrier were measured as described above in example 1. The effect of treatment with this solution on die attach bleed and lead frame attach bleed was also examined as described in Example 1. The results are shown in Table 2.

Comparative Example C

A mixture containing about 80 mL of propylene glycol monomethyl ether and 20 mL of water was prepared and applied onto a chip carrier via a dip coating method as described in comparative example A. The contact angles formed by a sessile drop of diluent ERL4299 on both the gold and polyimide surfaces of the chip carrier were measured as described above in example 1. The effect of treatment with this solution on die attach bleed and lead frame attach bleed was also examined as described in Example 1. The results are shown in Table 2.

Comparative Example D.

The contact angles formed by a sessile drop of diluent ERL-4299 on the gold an polyimide surfaces of a chip carrier that had not been treated with any solution were measured as described above in example 2. The contact angles on the polyimide surface and gold surface were 15° and 17°, respectively. Die attach bleed and lead frame attach bleed were observed in three out of three of the untreated chip carriers.

Comparative Example E

Circuitized chip carriers, whose surfaces had been roughened by pumice treatment, were treated as described above in example 1 except that the treatment solution contained 0.5% by volume of ENTEK-996 and 99.5% by volume of water. ENTEK-996 contains less than 15% by volume of diethylene glycol monobutyl ether. Stains were observed on the gold circuitry. Accordingly, a treatment solution which comprises more than 99% by volume of water and less than 1% by volume of an organic solvent is not suitable.

| Pumice Treatment | % Vol. Entek-996 | Solvent | Contact Angle-PI | Contact Angle-Au | Die Attach Bleed | Lead Frame Attach Bleed |
|---|---|---|---|---|---|---|
| + | 0.0 | 20% IPA 80% $H_2O$ | 17° | 30° | 2/18 | 6/6 |
| + | 2.0 | 20% IPA 80% $H_2O$ | 60° | 59° | 0/12 | 0/12 |
| + | 3.0 | 20% IPA 80% $H_2O$ | 60° | 67° | 0/10 | 0/10 |
| + | 5.0 | 20% IPA 80% $H_2O$ | 60° | 61° | — | — |
| − | 0.5 | 20% IPA 80% $H_2O$ | 49° | 47° | 0/3 | 0/3 |
| − | 1.0 | 20% IPA 80% $H_2O$ | 59° | 58° | 0/19 | 0/12 |
| − | 3.0 | 20% IPA 80% $H_2O$ | 60° | 67° | 0/10 | 0/10 |

PI = polyimide
IPA = isopropyl alcohol

TABLE 2

| % of Fatty Acid (w/v) in Treatment Solution | Solvent | Contact Angle-PI | Contact Angle-Au | Die Attach Bleed | Lead Frame Attach Bleed |
|---|---|---|---|---|---|
| 0.0 | 80% BC 20% $H_2O$ | 17° | 19° | 3/3 | 3/3 |
| 0.0 | 80% PGME 20% $H_2O$ | 16° | 14° | 3/3 | 3/3 |
| 0.1 | 20% IPA | 48° | 47° | 0/3 | 0/3 |

TABLE 2-continued

| % of Fatty Acid (w/v) in Treatment Solution | Solvent | Contact Angle-PI | Contact Angle-Au | Die Attach Bleed | Lead Frame Attach Bleed |
|---|---|---|---|---|---|
| 0.2 | 80% H₂O 20% IPA 80% H₂O | 45° | 46° | 0/3 | 0/3 |

BC = Butyl carbitol
PGME = Propylene Glycol Monomethyl Ether
PI = Polyimide
IPA = Isopropyl alcohol As shown in Tables 1 and 2, the surface of the organic substrates treated in accordance with the present method exhibited reduced wettability to the epoxy liquid ERL 4299, i.e. the treatment increased the contact angle between the surface of the substrate and a drop of epoxy liquid. As shown in Tables 1 and 2, treatment of circuitized polyimide substrates in accordance with the present invention also decreased the wettability of the gold components with respect to the epoxy liquid. As shown in Table 1, the decreased wettability of the organic substrate even occurred when the substrates were subjected to roughening by pumice treatment prior to the present treatment. As shown in Tables 1 and 2, treatment of a circuitized organic substrate in accordance with the present method also eliminated adhesive die attach bleed and lead frame attach bleed.

While the invention has been described to some degree of particularity, various adaptations and modifications can be made without departing from the scope of the invention as defined in the appended claims.

What is claimed is:

1. A treatment solution for reducing adhesive resin bleed on a surface of an organic substrate, said solution comprising:
    (a) a fatty acid compound in an amount of between 0.001% to 0.5% by weight of the solution;
    (b) less than 5% of an alkalizing agent,
    (c) a solvent comprising an aqueous solution and from about 5% to about 90% by volume of an organic solvent selected from the group consisting of an alcohol, a glycol ether, and combinations thereof; and
    (d) between about 0.01 and about 3% of a chelating agent.
2. The treatment solution according to claim 1 wherein the alkalizing agent is selected from the group consisting of KOH, NaOK, (Ca)₂OH, NH₄OH, and triethanolamine.

3. The treatment solution according to claim 1 wherein the organic solvent is alcohol present in an amount from about 10% to about 30% by volume of the aqueous solution.

4. The treatment solution according to claim 3 wherein the alcohol is an aliphatic alcohol selected from the group consisting of methanol, ethanol, propanol, isopropanol, butanol, pentanol and amyl alcohol.

5. The treatment solution according to claim 1 wherein the chelating agent is selected from the group consisting of EGTA, triethanolamine and EDTA.

6. The treatment solution according to claim 1 wherein the fatty acid has the formula:

wherein R₁ is a saturated or unsaturated hydrocarbon having 5 to 32 carbon atoms;

Y₁ is a H, a hydrocarbon, or a hydroxyl at any position along R₁;

Y₂ is a H, a hydrocarbon, or a hydroxyl at any position along R₁

Z is O, N, or S; and

R₂ is a saturated or unsaturated, branched or unbranched hydrocarbon having 1 to 12 carbon atom, a salt, or H.

7. The treatment solution according to claim 1 wherein the pH is between 7.2 and 10.6.

8. The treatment solution according to claim 1 wherein the fatty acid is stearic acid.

* * * * *